United States Patent

Nozawa

(10) Patent No.: US 6,746,806 B2
(45) Date of Patent: Jun. 8, 2004

(54) LITHOGRAPHY MASK BLANK AND METHOD OF MANUFACTURING THE SAME

(75) Inventor: Osamu Nozawa, Fuchu (JP)

(73) Assignee: Hoya Corporation, Tokyo (JP)

( * ) Notice: Subject to any disclaimer, the term of this patent is extended or adjusted under 35 U.S.C. 154(b) by 54 days.

(21) Appl. No.: 09/998,422

(22) Filed: Dec. 3, 2001

(65) Prior Publication Data

US 2002/0098422 A1 Jul. 25, 2002

(30) Foreign Application Priority Data

Dec. 1, 2000 (JP) .......................... 2000-367844
Oct. 26, 2001 (JP) .......................... 2001-329132

(51) Int. Cl.$^7$ ................................. G03F 9/00
(52) U.S. Cl. ........................................... 430/5
(58) Field of Search .................... 430/5, 322, 323, 430/324; 378/34, 36

(56) References Cited

U.S. PATENT DOCUMENTS 5,721,075 A * 2/1998 Hashimoto et al. ............ 430/5
5,834,142 A * 11/1998 Yabe et al. ..................... 430/5
5,939,227 A   8/1999 Smith ............................. 430/5

FOREIGN PATENT DOCUMENTS

| JP | 7-104457 | 4/1995 | ............ G03F/1/08 |
| JP | 8-220731 | 8/1996 | ............ G03F/1/08 |
| JP | 2002-162726 A | 6/2002 | |

* cited by examiner

Primary Examiner—Stephen Rosasco
(74) Attorney, Agent, or Firm—Sughrue Mion, PLLC

(57) ABSTRACT

In a method of annealing a workpiece which has a substrate and a light absorption film on the substrate, a laser beam is irradiated onto a workpiece to only heat the light absorption film without any temperature rise of the substrate and to anneal an internal stress of the light absorption film. A wavelength of the laser beam is selected so as to be absorbed into the light absorption film. The workpiece may be a photo mask blank (or a photo mask) or a phase shift mask blank (or a phase shift mask).

11 Claims, 2 Drawing Sheets

LITHOGRAPHY MASK BLANK AND METHOD OF MANUFACTURING THE SAME

BACKGROUND OF THE INVENTION

This invention relates to a method of manufacturing a mask blank and a mask each of which is used in a lithography process on fabricating a semiconductor device or the like and, in particular, to a mask blank and a method pertinent to KrF excimer laser, ArF excimer laser, or $F_2$ excimer laser.

With fineness of a semiconductor circuit and the like, it is a recent trend that requirements have been directed to using an exposure source of a short wavelength in lithography and using lenses of a high numerical aperture (NA) in an exposure apparatus. However, it is to be noted that a high numerical aperture (NA) of the exposure lenses and a depth of focus reside in a trade-off relationship.

In order to attain a depth of focus, flatness required for a photo mask has become severe more and more and should be recently reduced to a range from 0.3 μm to less than 0.5 μm.

In the meanwhile, the flatness of the photo mask depends on bending strength of the transparent substrate, flatness of a substrate prior to deposition of any films, and internal stress of films that form a circuit pattern and the like. Among others, the internal stress of the films has raised a serious problem. Herein, flatness is defined by a difference between a highest point and a lowest one from an average plane determined on a surface used for exposure and can be given by measuring a configuration of a substrate by the use of an optical interferometer. The internal stress is given by the following formula (1):

$$Eb2/[6(v-1)rd] \quad (1)$$

where E is representative of Young's modulus; b, a thickness of a substrate; v, a Poisson's ratio; r, a variable component of a radius of curvature of the substrate; and d, a thickness of a thin film.

In order to satisfy the flatness required for the photo mask, the film for forming the circuit pattern has the internal stress preferably not greater than $5 \times 10^8$ Pa when use is made of a synthetic quartz substrate of 6 inches square that has a thickness of 0.25 inch and that has films of 70 nm thick.

The internal stress of the films for the circuit pattern is generated during a process of manufacturing a photo mask blank that may be called a substrate with films and that serves to form a photo mask. Taking this into consideration, it has been found out that flatness should be improved in a photo mask blank so as to establish excellent flatness of the photo mask.

Herein, consideration is made about a method of controlling stress of the films for forming the circuit pattern. A method of controlling such stress can include a method of adjusting during a stage of depositing the film and a method of adjusting after deposition of the film.

In the method of adjusting during the deposition stage, a difficulty is present about making adjustment of the stress compatible with keeping characteristics necessary for the photo mask blank. Such characteristics may be an optical characteristic, chemical durability, and the like. Especially, it is often difficult to adjust the stress by deposition conditions in the case where the internal stress is compressive stress.

On the other hand, the instant has already filed Japanese Patent Application No. 2000-277215 and has proposed a method of reducing compressive stress in films for forming the circuit pattern. According to this method, a mask blank is manufactured by utilizing heat treatment carried out after deposition of films.

As any other conventional treatment methods, consideration is made about a method of using a clean oven, a method of using a hot plate, a method of using a lamp heater.

In Japanese Unexamined Patent Publication No. Hei 7-104457, namely, 104457/1995, disclosure is made about a method of manufacturing a half tone phase shift mask. Specifically, the method deposits a translucent film and thereafter forms a stabilization layer on the translucent film. The stabilization layer serves to protect a variation of characteristics in the translucent film that might occur due to irradiating light by a mercury lamp, heating, oxidizing, and due to irradiation of exposure light.

Alternatively, disclosure is also made in Japanese Unexamined Patent Publication No. Hei 8-220731, namely, 220731/1996 about a technique of stabilizing a translucent film of a half tone phase shift mask. According to this technique, the translucent film is irradiated by light, heat, an electromagnetic wave, a particle beam after deposition in an atmosphere of a vacuum, a rare gas, or a reactive atmosphere. In this case, a light source for irradiating light and the like may be, for example, either one of a heavy hydrogen lamp, a Xe lamp, and an excimer laser source, or a combination thereof.

Among the above-mentioned conventional methods, the heat treatment method should heat the transparent substrate to a high temperature not lower than 400° C. with the film deposited on the transparent substrate, so as to reduce or alleviate the internal stress of the film. Such a high temperature inevitably lengthens heating and cooling time and lowers productivity.

When heat treatment is carried out by the use of the heat processing apparatus, there is a temperature limit. Consequently, a reduction effect of the internal stress is insufficient for flatness required for the photo mask.

In addition, the light irradiation for the above-mentioned stabilization is not enough to reduce the internal stress because the film can not be heated to a temperature sufficient to alleviate the internal stress.

SUMMARY OF THE INVENTION

It is a first object of this invention to provide a method of manufacturing a mask blank, wherein a time needed for improving an internal stress is very short and the internal stress is remarkably improved.

Especially, this invention makes it possible to improve an internal stress of a film that has a difficulty of improving the internal stress and provides the method of manufacturing the mask blank, wherein the internal stress of the film is largely improved.

It is another object of this invention to provide a method of manufacturing the mask blank, which can reduce the internal stress in the film and also improve optical characteristics of the film.

It is still another object of this invention to provide a mask blank or a mask that is not greater than 0.5 μm in flatness.

In order to accomplish the above-mentioned objects, this invention has the following constitution.

(Constitution 1)

A method is for use in manufacturing a lithography mask blank on a transparent substrate. According to this invention, the method comprises the steps of depositing, on the transparent substrate, at least one light absorption film which has a property of absorbing a laser of a predetermined wavelength, and irradiating a laser beam of the predetermined wavelength onto the light absorption film to heat the light absorption film and to thereby alleviate its internal stress.

(Constitution 2)

The mask blank according to Constitution 1 is a phase shift mask blank and the light absorption film is formed by a translucent film which serves as a phase shift film of the phase shift mask blank so as to attenuate exposure light of predetermined intensity.

(Constitution 3)

The mask blank mentioned in Constitution 1 has at least one shield or opaque film and the light absorption film is formed by the opaque film.

(Constitution 4)

In the method according to either one of Constitutions 1 through 3, the laser beam is irradiated onto the mask blank so that the transparent substrate with the light absorption film has flatness not greater than 0.5 $\mu$m.

(Constitution 5)

A lithography mask blank according to Constitution 5 is manufactured by the method mentioned in either one of Constitutions 1 through 4.

(Constitution 6)

A lithography mask according to Constitution 6 is manufactured by the use of the mask blank mentioned in Constitution 5.

In order to accomplish the above-mentioned objects, the transparent substrate after deposition of the light absorption film is irradiated by a laser beam in this invention to heat the light absorption film. A stress annealing or alleviating effect according to this invention might result from an effect similar to a heat treatment. However, the laser annealing according to this invention is featured by heating a film for an extremely short time of, for example, several tens of nanoseconds and by heating the film to a highest heating temperature of 1000° C. or more. The above-mentioned features bring about a high annealing effect and high productivity that can not be accomplished by the conventional methods.

Specifically, the laser light or beam is transmitted through the transparent substrate but absorbed by the light absorption film. Taking this into consideration, the laser beam of sufficient intensity is irradiated onto the film for such a short time that any damage takes place in the film and heat is not conducted from the heated film to the transparent substrate. In this case, the light absorption film is effectively heated but the transparent substrate is scarcely heated.

Herein, it is to be noted that the thickness of the light absorption film is sufficiently thin in comparison with that of the transparent substrate. Therefore, the light absorption film heated by the laser beam is quickly cooled as compared with the transparent substrate that is not heated after the laser irradiation. Eventually, the temperature of the transparent substrate with the light absorption film is kept substantially invariable during the light irradiation.

The method according to this invention can remarkably shorten the heating and the cooling times and improve the productivity by the above-mentioned effect and is more advantageous in comparison with the conventional method of heating a whole of the transparent substrate with the film by using the oven or the hot plate.

In the method according to this invention, the light absorption film alone is selectively heated by irradiating the laser beam and the resultant transparent substrate is not damaged by the laser irradiation. This makes it possible to sufficiently strengthen the intensity of the laser beam and to sufficiently suppress the internal stress, such as the compressive stress, of the film that may be used for forming a circuit pattern, when the film is formed by the light absorption film. In addition, the internal stress is largely improved in this invention as compared with the conventional heat processing method. This is because the heat treatment is carried out at the temperature which is as high as 1000° C. and which can not be accomplished in the conventional heating apparatus.

As mentioned before, irradiating the laser beam onto the transparent substrate with the light absorption film is effective to greatly shift the compressive stress of the light absorption film to a tensile stress side. Consequently, the method according to this invention can easily accomplish desired flatness of the photo mask for a very short time.

Herein, this invention will be described in detail.

It is necessary in this invention to deposit, on a transparent substrate, at least one light absorption film having a property of absorbing a laser beam. In other words, the light absorption films may be composed of a plurality of light absorption layers.

Alternatively, the light absorption film may also be formed by a stacked structure of a light absorption lamina having a light absorption property and an upper lamina that has no light absorption property and a thin thickness. In this case, since the upper lamina having no light absorption property is thin enough, the light absorption lamina is sufficiently heated indirectly via the upper lamina by the laser irradiation. Such absorbing the laser light can be accomplished when the light absorption lamina is located at an uppermost position of either of the transparent substrate or a multi-layer structure or may be placed at a position intermediate between the multi-layer.

The light absorption film which has the light absorption property may be a translucent film used in the half tone phase shift mask or an opaque film in the binary mask or a Levenson phase shift mask. In other words, the light absorption film may be used as a light translucent phase shift film in the half tone phase shift mask blank or an opaque film in the photo mask blank as it is, when exposure is made by using a laser, such as KrF excimer laser, ArF excimer laser, F2 excimer laser, as an exposure light source.

When deposition is made of a plurality of light absorption laminae or a stacked structure of a light absorption lamina and a light non-absorption lamina, the plural laminae may be operable as a light translucent phase shift film in the half tone phase shift mask blank or as an opaque film or a circuit pattern forming film in the photo mask blank.

As a material of the light absorption film operable as the translucent film in the phase shift mask blank, it is possible to exemplify nitrides or nitride oxides of metal and silicon (metal may be, for example, Mo, Ti, V, Zr, Nb, Ta, W, Hf, Cr and etc.), metal nitrides, and/or metals. In this event, the light absorption film is operable not only to absorb the laser beam irradiated on heating the film but also to transmit the laser beam irradiated from an exposure source to some extent. Herein, the light non-absorption film may be formed, for example, by $SiO_2$, $Si_3N_4$, $Al_2O_3$, $CaF_2$, CrOx, CrFx, and so on.

As regards the phase shift mask blank, it is preferable to carry out heat treatment due to laser irradiation of a laser that has the same wavelength as the laser light source used as the exposure light source. However, it should be considered that high power KrF, ArF, F$_2$ excimer lasers seriously damage an optical system. Taking the above into account, XeCl laser may be practically used which has a wavelength of 308 nm comparatively near to a light source wavelength of the exposure light source.

The light absorption film which as an opaque film in the photo mask blank may be, for example, Si, Ti, V, Cr, Zr, Nb, Mo, Ta, W, Ru, Rh, Hf or the like. In this case, such a light absorption film acting as the opaque film is operable not only to absorb a laser beam used for heating by irradiation but also to shield or shade a laser beam or the like for exposure. This means that the light absorption film has a dense optical density for the laser beam or the like. On the other hand, a light non-absorption film usable for the photo mask blank may be, for example, Si3N4, CrOx, CrFx, or the like.

As for the photo mask blank, the laser irradiation for heating be preferably carried out by the same wavelength as that of the laser source used as the exposure light source but may be carried out by a wavelength which is longer than that of the exposure light source.

In general, the light absorption film according to this invention may be formed by a material that may have an absorption ability of a laser beam. At any rate, such a material may be used for an etching mask film, an antireflection film, or any other films used for any other purposes.

Herein, description will be made about an advantage of this invention in the following. As regards the phase shift mask blank, the conventional heat processing method of heats a whole of a transparent substrate with a translucent film which satisfies optical characteristics as the phase shift mask and can not often sufficiently reduce the internal translucent film of the translucent film. On the other hand, when a high power laser beam is irradiated for a short time in accordance with this invention, the internal stress of the translucent film is effectively and greatly reduced as compared with the conventional heat processing method mentioned above. Output power of the laser beam should be preferably increased within a range of giving no damage onto the film or the substrate. Such high power irradiation can shorten a process time (second unit). In any event, the output power of the laser beam is higher than that of the laser beam used for exposure.

Specifically, this invention can reduce the internal stress of the translucent film to zero or about zero, even when the translucent film is formed by a material that can not reduce the internal stress in the conventional methods. Such a translucent film that can not always reduce the internal stress by the use of the conventional methods may be, for example, nitrides or nitrided oxides of metals and silicon, or a multi-layer composed of a combination of Si$_3$N$_4$, and metal nitrides.

Furthermore, when this invention is applied to the phase shift mask blank, it is possible not only to reduce the internal stress of the translucent film but also to improve the optical characteristics of the translucent film required for the optical characteristics of the phase shift mask blank. Herein, the optical characteristics of the translucent film may be, for example, a desired transmittance and phase angle for exposure light, a required transmittance for test light, chemical durability, irradiation durability, and the like. According to the inventors' experimental studies, it has been found out that a variation of the transmittance and phase angle due to the laser irradiation of this invention is improved in comparison with the conventional heat processing method. This shows that this invention can improve only the internal stress by the laser irradiation with the variation of the transmittance and phase angle suppressed.

Consideration will further be made about the wavelength of the laser beam in the following. The wavelength of the laser beam may be varied in dependency upon a film material and, therefore, can not be definitely determined. However, the wavelength of the laser beam preferably falls within a range between 157 and 633 nm, and more preferably within a range between 248 and 308 nm. In addition, laser intensity can not be definitely determined because it differs from each material of the translucent film but an energy density may be preferably between 100 mJ/cm$^2$ and 500 mJ/cm$^2$, more preferably between 200 mJ/cm$^2$ and 400 mJ/cm$^2$. At any rate, it is preferable that heating due to laser irradiation may be performed in a vacuum or an inert gas.

As regards the photo mask blank, this invention is also effective to efficiently reduce the internal stress of the opaque film by laser irradiation, in comparison with the conventional heat processing method.

Specifically, this invention can reduce the internal stress of the opaque film to zero or about zero, even when the opaque film is formed by a material that can not reduce the internal stress in the conventional methods. Such an opaque film that has a difficulty of reducing the internal stress by the use of the conventional methods may be, for example, Ta, Si, Nb, Mo, W, and so on.

Like in the translucent film, when this invention is applied to the photo mask blank, it is possible not only to reduce the internal stress of the opaque film but also to improve the optical characteristics of the opaque film required for the optical characteristics of the photo mask blank. Herein, the optical characteristics of the opaque film may be, for example, an optical density, chemical durability, irradiation durability and the like.

As regards the wavelength of the laser beam, it may be varied in dependency upon a film material of the opaque film and, therefore, can not be definitely determined. However, the wavelength of the laser beam preferably falls within a range between 157 and 633 nm, and more preferably within a range between 248 and 308 nm. In addition, laser intensity can not be definitely determined because it differs from each material of the opaque film but an energy density may be preferably between 50 mJ/cm$^2$ and 500 mJ/cm$^2$, more preferably between 100 mJ/cm$^2$ and 300 mJ/cm$^2$.

When the light absorption film is composed of a plurality of laminae, laser irradiation in this invention may be repeated plural times by selecting an optimum laser wavelength and laser intensity.

In the case of the phase shift mask blank, the light absorption film for the laser beam may preferably have flatness not greater than 0.5 $\mu$m after laser irradiation of the transparent substrate, and more preferably, not greater than 0.4 $\mu$m, 0.3 $\mu$m, or 0.2 $\mu$m.

Likewise, in the case of the photo mask blank, the light absorption film for the laser beam may preferably have flatness not greater than 0.5 $\mu$m after laser irradiation of the transparent substrate, and more preferably, not greater than 0.4 $\mu$m, 0.3 $\mu$m, or 0.2 $\mu$m.

Thus, it is possible for this invention to highly improve the internal stress and to enhance an amount of improvement in the flatness to not smaller than 0.3 $\mu$m. Such improvement can be established during a very short time (several seconds). Specifically, the flatness of 0.8 $\mu$m or more can be achieved for a very short time and can not be accomplished by the heat treatment.

In the phase shift mask or mask blank and the manufacturing the same, no restriction is imposed on the transparent substrate, if the transparent substrate is transparent for an exposure wavelength. Such a transparent substrate may be, for example, a quartz substrate, a fluorite surface, and any other glass substrates or hardened substrates (formed by soda-lime glass, aluminosilicate glass, aluminoborosilicate glass, or the like.

Furthermore, a patterning process (patterning or masking process) of processing the film on the substrate may be carried out by the use of a known lithography technique (photo or electron beam lithography technique) that is used to coat resist, expose, develop, etch, peel the resist, and clean.

Eventually, the laser irradiation may be carried out after deposition of forming patterns.

DESCRIPTION OF THE PREFERRED EMBODIMENTS

Figure 1:
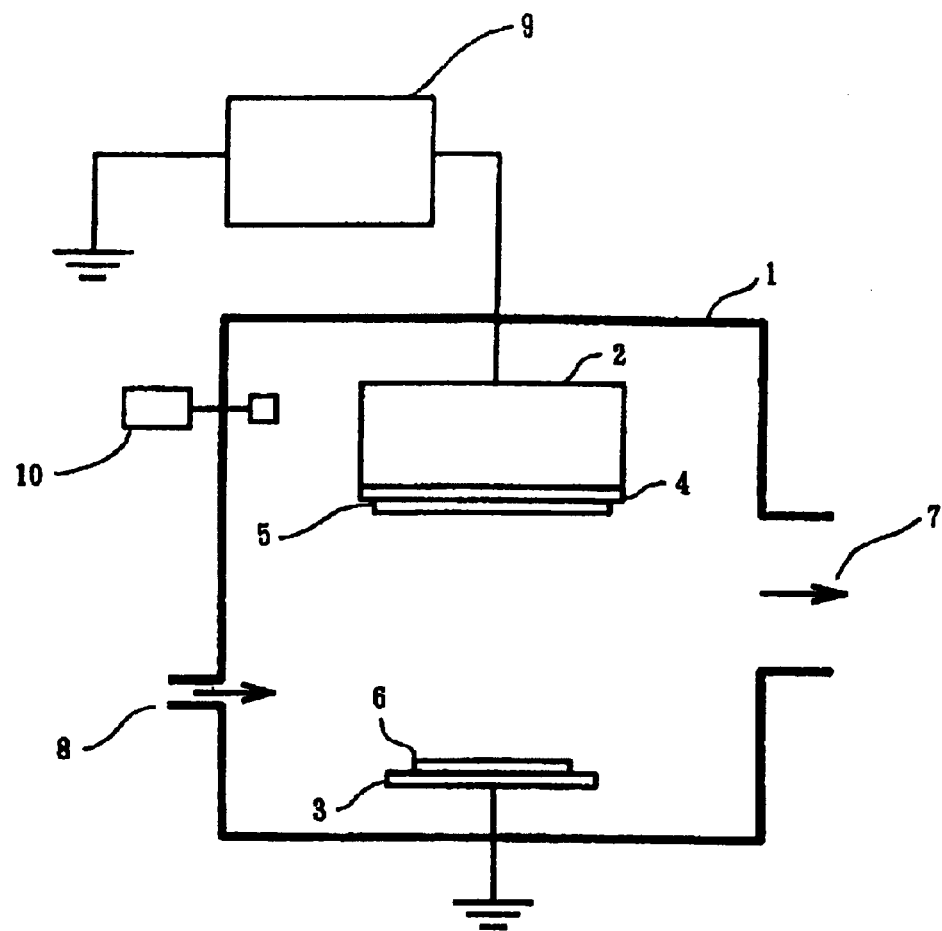
FIG. 1 shows a diagrammatic view of a D.C. magnetron sputtering apparatus that is used in this invention.

Referring to FIG. 1, description will be made about a D.C. magnetron sputtering apparatus that is used for manufacturing various photo mask blanks concerned with this invention. As shown in FIG. 1, the D.C. magnetron apparatus has a vacuum chamber 1, a magnetron cathode 2, and a substrate holder 3. Both the magnetron cathode 2 and the substrate holder 3 are located within the vacuum chamber 1, as illustrated in FIG. 1. A backing plate 4 is bonded to the magnetron cathode 2 and a sputtering target 5 is mounted on the backing plate 4. In the illustrated example, the backing plate 4 is composed of oxygen-free copper and is adhered to the sputtering target 5 by the use of indium. The backing plate 4 may be directly or indirectly cooled by a water-cooled mechanism (not shown). In any event, the magnetron cathode 2, the backing plate 4, and the sputtering target 5 are electrically connected to each other. On the other hand, the illustrated substrate holder 3 holds a transparent substrate 6.

The vacuum chamber 1 is exhausted by a vacuum pump through an exhaust outlet 7 to a degree of vacuum such that an atmosphere in the vacuum chamber 1 adversely affects a property of a film deposited in the vacuum chamber 1. Under the circumstances, a gas is introduced into the vacuum chamber 1 through a gas inlet 8 and a negative voltage is imposed onto the magnetron cathode 2 by a D.C. power source 9. Thus, sputtering is started within the vacuum chamber 1. The illustrated D.C. power source 9 has an arc detection function and can monitor a discharge state during the sputtering. In this event, a pressure of the vacuum chamber 1 is measured by a pressure gauge 10.

Specifically, the sputtering target 5 in the illustrated example is formed by a mixed target of molybdenum (Mo) and silicon (Si) that comprises, by mol %, 8 of Mo and 92 of Si. Reactive sputtering is carried out in a mixed gas atmosphere of argon (Ar) and nitrogen ($N_2$) so as to deposit, on the transparent substrate 6, a thin film of MoSiN which may be called nitrided molybdenum and silicon. In the mixed gas atmosphere, Ar and $N_2$ are mixed at a rate of 10% and 90% and a pressure is kept at 1.5 mTorr.

In this example, the thin film is deposited to a thickness of about 672 angstroms and has transmittance of 5.5% and a phase angle of 180° for a wavelength of 193 nm (equal to the wavelength of ArF excimer laser). The thin film has an optimum optical characteristic as a translucent film and can be used for a phase shift mask blank.

Figure 2:
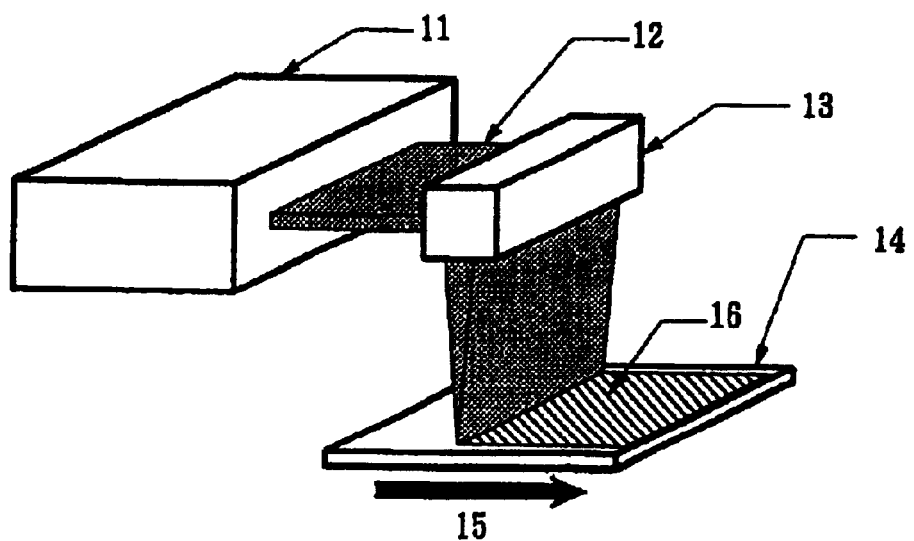
FIG. 2 shows a diagrammatic view of a laser annealing apparatus used in this invention.

Referring to FIG. 2, a laser anneal apparatus is used to irradiate a laser beam onto the transparent substrate 6 with the above-mentioned translucent film deposited in the above-mentioned manner. Such irradiation is preferably carried out within a vacuum. Herein, it is assumed that the transparent substrate 6 has a size of 152 mm×152 mm×6.35 mm and is formed by synthesized quartz. The transparent substrate 6 after deposition of the translucent film on the transparent substrate 6 will be often called a workpiece for brevity of description.

As shown in FIG. 2, the laser anneal apparatus has an excimer laser oscillator 11 for generating a sheet-like laser beam 12 and a line beam optical system 13 for shaping the sheet-like laser beam 12 into a line shaped beam. Such a sheet-like laser beam 12 can be generated by the use of a known excimer laser manufactured and sold by Lambda Physik while the line beam optical system may be structured by a homogenizer. The line shaped beam is adjusted by the homogenizer so that it has a long axis width of 150 mm and a short axis width of 0.550 mm. The line shaped beam is irradiated onto the workpiece on a side of the translucent film which is deposited in the manner mentioned in conjunction with FIG. 1. In the illustrated example, the laser oscillator 11 is assumed to be a XeCl excimer laser and can generate the laser beam which has a wavelength of 308 nm and a pulse frequency of 200 Hz. Each single pulse of the laser beam is controlled so as to have energy density of 300 mJ/cm$^2$ on the translucent film deposited on the transparent substrate 14.

The workpiece is fixed to a stage mechanism (not shown) that has a feeding mechanism for carrying out feeding operation in a short axis direction of the line shaped beam. The workpiece is moved in a direction (depicted by an arrow 15) by a length of 0.05 mm that is somewhat shorter than the short axis width of the line beam each time, each time after a single pulse is irradiated onto the transparent substrate 14. The length of 0.05 mm may be called a unit distance hereinafter. Thus, laser beam irradiation and stage movement are successively repeated and the line shaped laser beam is successively irradiated onto a region (depicted by 16) of the transparent substrate 14 with the translucent film faced towards the line shaped beam. In other words, such irradiation of the line shaped laser beam may be called a line scanning operation.

Herein, it is to be noted that such a line scanning operation should be uniformly executed on a whole of the transparent substrate 14 without any seam left between two adjacent scanning lines. In order to realize a seamless line scanning operation on the workpiece, it is necessary to adjust the unit distance of the stage mechanism and a shape of the line shaped beam along the short axis direction. In addition, the line shaped laser beam is also adjusted in the long axis direction of the line shaped laser beam so as to keep uniformity of energy of the line shaped laser beam and energy of each pulse of the line shaped laser beam.

The translucent film deposited in the above-mentioned manner absorbs a wavelength of 308 nm that is equal to that of the XeCl laser. On the other hand, the transparent substrate 14 of the synthesized quartz does not absorb the wavelength of 308 nm. On irradiating the XeCl laser onto the workpiece, the transparent substrate 6 is scarcely heated by the XeCl laser of 308 nm because of non-absorption of the wavelength of 308 nm and, instead, the translucent film alone is heated by the XeCl laser. Furthermore, the transparent substrate 14 used in FIG. 2 has a thickness of 6.35 mm and is remarkably thicker than that of the translucent film deposited thereon. Therefore, the transparent substrate 14 with the translucent film, namely, the workpiece hardly rises up in temperature after irradiation of the XeCl laser. In consequence, no cooling is needed about the transparent substrate 14 after the irradiation.

Herein, flatness of the transparent substrate 14 has been measured before and after deposition of the translucent film. As a result of measurement of the flatness, it has been found out that the flatness of the workpiece was measured on the translucent film deposited on the transparent substrate and specified by a convex of 0.9 μm after deposition of the translucent film. This shows that a heavy compressive stress took place in the translucent film.

On the other hand, the workpiece, namely, the transparent substrate with the translucent film was subjected to irradiation of the XeCl laser and to measurement of the flatness on the translucent film in the above-mentioned manner. Thereafter, comparison was made between the flatness of the workpiece before and after the XeCl laser irradiation.

Consequently, flatness variation on the transparent substrate 14, namely, the translucent film after the XeCl laser irradiation was reduced to a convex of 0.1 μm in comparison with the transparent substrate 14 before the deposition of the translucent film. This shows that the compressive stress in the translucent film was considerably alleviated or annealed by the XeCl laser irradiation.

Herein, it is to be noted that the flatness was measured within that region of the quartz substrate (152 mm×152 mm×6.35 mm) which was of a square shape of 146 mm×146 mm with exclusion zone of 3 mm wide. The flatness of the transparent substrate was defined by a height difference between a highest point and a lowest point measured from an average surface of the transparent substrate and was measured by the use of an interferometer manufactured and sold by Tropel in the name of "FlatMaster 200".

Stated otherwise, it has been found out that the transparent substrate before deposition of the translucent film had flatness specified by a convex of 0.2 μm while the transparent substrate with the translucent film deposited thereon after XeCl laser irradiation had flatness specified by a convex of 0.3 μm.

A phase angle was measured at the wavelength of 193 nm by immersing for 120 minutes into ammonia-hydrogen peroxide solution (29% $NH_3$: 30% $H_2O_2$: $H_2O$=1: 2:10 by volume ratio, temperature:20° C.).

To this end, provision was made about the workpieces, namely, the transparent substrates with the translucent films ones of which ware subjected to the XeCl laser irradiation and the other of which were not subjected to any irradiation. The former may be called an irradiated workpiece while the latter may be called non-irradiated workpieces. The phase angle was measured about both the irradiated workpiece and the non-irradiated workpiece before and after immersion into the ammonia-hydrogen peroxide solution. As a result, a difference of the phase angles between the non-irradiated workpieces was 3.8° before and after the immersion while the difference of the phase angles between the irradiated workpieces was reduced to 2.3° after the immersion. This shows that chemical durability in the irradiated workpieces is improved by the laser irradiation.

Moreover, the transmittance was measured in connection with the irradiated workpieces and the non-irradiated workpieces by irradiating the ArF excimer laser of total irradiation energy of 30 kJ/cm2. In this event, a difference of the transmittance was measured about the irradiated workpiece and the non-irradiated workpiece before and after the irradiation of the ArF excimer laser. As a result, it has been found out that the difference of the transmittance in the non-irradiated workpiece was 0.45% while the difference of the transmittance in the irradiated workpiece was 0.13%. This shows that the irradiated workpiece according to this invention has a strong irradiation durability to exposure light as compared with the non irradiated workpiece.

From this fact, it is readily understood that the translucent film irradiated by the XeCl laser beam is small in internal stress and excellent in durability.

An irradiation time of the XeCl laser for each substrate was taken only sixteen (16) seconds. Even if four minutes were required so as to exchange gases in an atmosphere and to move each substrate, only forty-three (43) minutes were needed for processing ten substrates. This shows that the above-mentioned irradiation process has a very high throughput. In addition, transmittance of the translucent film after the laser irradiation is improved by 6% for an ArF excimer laser.

COMPARATIVE EXAMPLE 1

Provision was made of ten (10) transparent substrates which have translucent films deposited in the above-mentioned manner. The transparent substrates were set in a vertical furnace and subjected to heat treatment for one to two hours at a temperature of 200° C. and 400° C. As a result, it was confirmed that average variations or differences of flatness were specified by convexes of 0.7 μm and 0.5 μm relative to the transparent substrates before deposition of the translucent films and that a reduction effect of internal stress was very small as compared with the laser irradiation mentioned above in connection with this invention. The throughput of the comparative example was very low in comparison with the above-mentioned laser irradiation because three or four hours were required to process the ten substrates.

COMPARATIVE EXAMPLE 2

Figure 3:
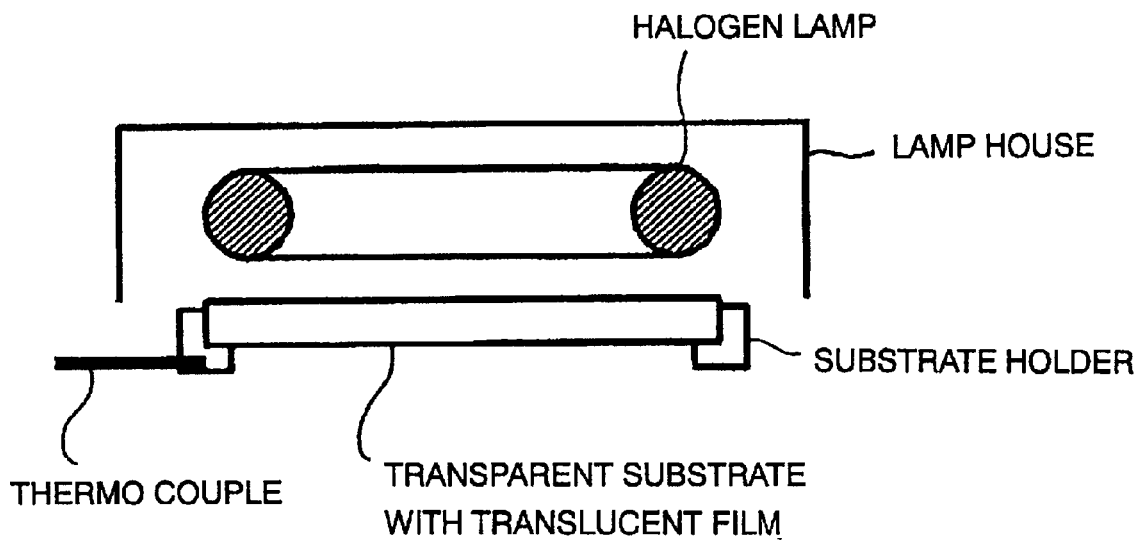
FIG. 3 shows a diagrammatic view of a halogen annealing apparatus used in a comparative example.

A halogen lamp anneal apparatus as illustrated in FIG. 3 was used to process the transparent substrates with the translucent films deposited in the same manner. Specifically, heat treatment was carried out in a vacuum for twenty minutes at a temperature of 400° C. When the flatness was measured about the transparent substrates of Comparative Example 2, it was specified by a convex of 1.1 μm before lamp annealing and by a convex of 0.7 μm after the lamp annealing. In other words, the compressive stress of the translucent film was large prior to the lamp annealing and was lowered to 0.7 μm after the lamp annealing. An improvement quantity of the compressive stress in the translucent film was as well as 0.4 μm and an improvement amount of flatness by the lamp annealing was equal to 0.4 μm. Moreover, the flatness was measured before and after the lamp annealing by changing the temperatures of heat treatment to 200° C. and 600° C. The results of measurement have been listed on Table 1 as an improvement amount of flatness against temperature.

COMPARATIVE EXAMPLE 3

Figure 4:
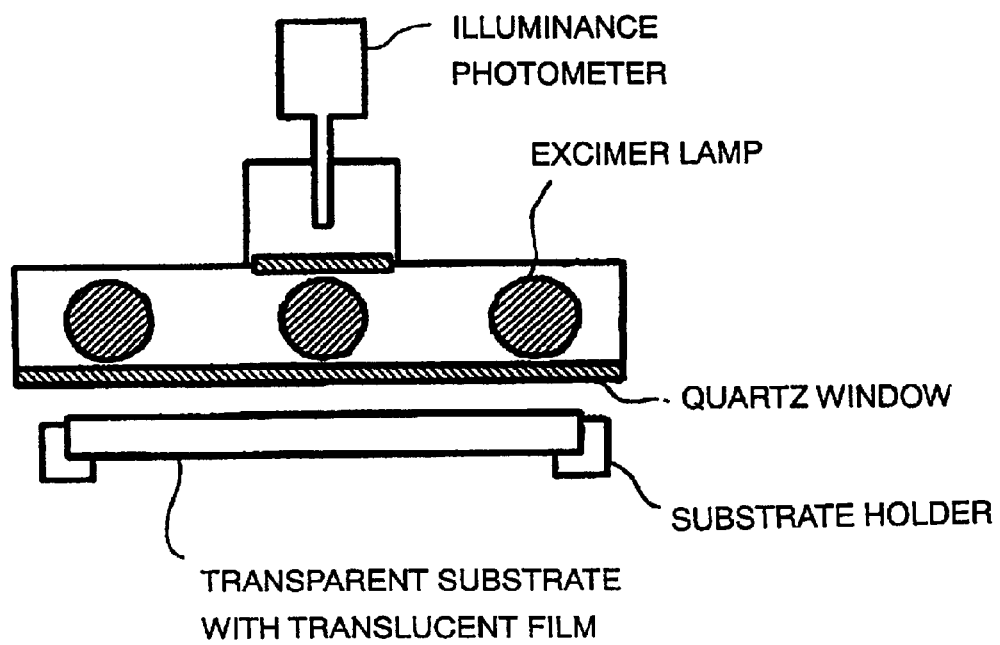
FIG. 4 shows a diagrammatic view of an excimer U.V. laser irradiation apparatus.

An excimer ultra violet (U.V.) ray irradiation apparatus as shown in FIG. 4 was used to optically process transparent substrates that have translucent films deposited in the above-mentioned manner. The optical processing was made in a nitrogen atmosphere for thirty minutes by irradiating an excimer laser beam having a wavelength of 172 nm. Optical intensity was about 10 mW/cm2. Flatness was measured about the transparent substrates before and after the optical processing. The resultant translucent films had flatness specified by a convex of 1.1 μm before the optical processing and exhibited a strong compressive stress. After the optical processing, the translucent films had flatness of 1.1 μm and were not improved in compressive stress.

In Table 1, a processing temperature, a processing time, an improvement amount of flatness (before and after each processing) are listed about translucent films which are processed by various manners and which are deposited on quartz substrates of square shapes and sixes of 152 mm×152 mm×6.35 mm.

TABLE 1

|  | Processing Method | Process Temperature | Process Time (From Start to End (Cooled to 100° C.)) | Improved Amount of Flatness (Before Processing)- (After Processing) |
|---|---|---|---|---|
| Embodiment 1 | laser annealing | room temperature | 16 seconds | 0.8 μm |
| Comparative Example 1 | heat treatment | 200° C. | 3–4 hours | 0.2 μm |
| Comparative Example 1 | heat treatment | 400° C. | 3–4 hours | 0.4 μm |
| Comparative Example 2 | halogen lamp | 200° C. | 2 hours | 0.1 μm |
| Comparative Example 2 | halogen lamp | 400° C. | 3 hours | 0.4 μm |
| Comparative Example 2 | halogen lamp | 600° C. | 4 hours | 0.7 μm |
| Comparative Example 3 | excimer lamp | room temperature | 30 minutes | 0.0 μm |

The above results might show that the stress annealing effect according to this invention may take place on the basis of an effect similar to heat treatment. However, this invention can realize an excellent stress annealing effect higher than the conventional processes as well as a high productivity.

Second Embodiment:

In the second embodiment, a silicon thin film of 700 angstroms thick was deposited on a transparent substrate by using a silicon target as a sputtering target and by carrying out sputtering in an argon gas atmosphere that had a pressure of 1.5 mTorr. The silicon thin film deposited in the second embodiment exhibited an optical density (O.D.) not smaller than 3, for a wavelength of 193 nm generated by ArF excimer laser and had an optical characteristic as a light shield or shielding film of a photo mask blank. Next, the transparent substrate with the opaque film deposited in the above-mentioned manner was subjected to laser irradiation in a manner similar to that described in connection with the first embodiment. In this case, energy density was set at 200 mJ/cm$^2$ on the transparent substrate with the opaque film.

At this time, flatness of the transparent film according to the second embodiment was measured in a manner similar to the first embodiment before and after deposition of the opaque film. As a result, it has been confirmed that a variation of the flatness after deposition of the opaque film was specified by a convex of 0.6 μm and the opaque film had a large compressive stress. However, when the transparent substrate with the opaque film was subjected to XeCl laser irradiation, a variation of the flatness was changed to 0.1 μm on a concave side (namely, −0.1 μm on a convex side) in comparison with a transparent substrate without any opaque film. This shows that the compressive stress of the opaque film is annealed or alleviated.

Stated otherwise, the flatness of the transparent substrate used in the second embodiment was specified by a convex of 0.3 μm before deposition of the translucent film and the flatness was changed to 0.2 μm after the laser irradiation of the transparent substrate with the translucent film.

Third Embodiment:

In the third embodiment, a silicon thin film of 298 angstroms thick that was nitrided was deposited on a transparent substrate by using a silicon target as a sputtering target and by carrying out reactive sputtering within an atmosphere of a mixed gas of argon and nitrogen (Ar:$N_2$=10:90%) kept at a pressure of 1.0 mTorr. Thereafter, the target was changed to a tantalum target and a tantalum thin film nitrided of 52 angstroms thick was deposited on the transparent substrate by reactive sputtering within an atmosphere of a mixed gas of argon and nitrogen (Ar:$N_2$=10:90%) kept at a pressure of 1.0 mTorr. Furthermore, the sputtering target was changed to a silicon target and reactive sputtering was carried out within an atmosphere of a mixed gas of argon and nitrogen (Ar:$N_2$=10:90%) kept at a pressure of 1.5 mTorr. As a result, a nitrided silicon thin film of 52 angstroms thick was deposited on the transparent substrate. Next, the sputtering target was replaced by a tantalum target and reactive sputtering was made within an atmosphere of a mixed gas of argon and nitrogen (Ar:$N_2$=10:90%) kept at a pressure of 1.5 mTorr. Thus, a nitrided tantalum thin film of 52 angstroms thick was deposited on the transparent substrate. The structure of the four thin films mentioned above is similar to that described in U.S. Pat. No. 5,939,227.

The four-film structure manufactured in the third embodiment has a transmittance of 6% and a phase angle of 180° for a wavelength of 193 nm generated by ArF excimer laser. Accordingly, the film structure is optimum as a translucent film of a phase shift mask blank.

Thus obtained transparent substrate with the above-mentioned film structure was subjected to laser irradiation in a manner similar to that mentioned in conjunction with the first embodiment. At this time, energy density of the laser beam was set at 350 mJ/cm$^2$ on the transparent substrate having the opaque film. As regards the transparent substrate according to the third embodiment, flatness was measured in a manner similar the first embodiment before and after deposition of the opaque film. The resultant variation of the flatness after the translucent film was specified by a convex of 1.3 μm and the opaque film had a large compressive stress. On the other hand, a variation of the flatness after the XeCl laser irradiation was given by a convex of 0.2 μm in comparison with the transparent substrate before the opaque film.

Stated otherwise, the flatness of the transparent substrate used in the third embodiment was specified by a convex of 0.2 μm before the deposition of the translucent film while the flatness of transparent substrate was specified by 0.4 μm after laser irradiation onto the transparent substrate with the translucent film. The transmittance of the translucent film after the laser irradiation was increased to 6.6% for the ArF excimer laser.

While this invention has thus far been described in conjunction with several embodiments thereof, it will readily be possible for those skilled in the art to put this invention into practice. For example, this invention is applicable to a method of manufacturing a mask blank which has at least one light absorption film on a transparent substrate. This is because of the reason of obtaining the effect according to this invention. The wavelength and intensity of the irradiated laser beam may be changed in consideration of stress to be improved and the optical characteristic of the light absorption film. At any rate, the method of manufacturing the mask blank according to this invention can considerably shorten a time for improving stress and remarkably reduce the internal stress. Especially, this invention can improve the internal stress of such films wherein a reduction is difficult about the internal stress by the conventional methods. An amount of improvement in the internal stress is very large in this invention in comparison with the conventional heat treatment. Furthermore, this invention can not only reduce the internal stress in the thin film but also improve the optical characteristic of the thin film. In addition, it is possible in this invention to realize the mask blank or mask having flatness not larger than 0.5 $\mu$m.

What is claimed is:

1. A method of manufacturing a lithography mask blank on a glass substrate, comprising the steps of:

depositing, on the glass substrate, at least one light absorption film which has a property of absorbing a laser beam of a predetermined wavelength which transmits the glass substrate; and irradiating the laser beam of the predetermined wavelength onto the light absorption film to selectively heat the light absorption film and to thereby alleviate its internal stress.

2. A method as claimed in claim 1, wherein the mask blank is a phase shift mask blank while the light absorption film is formed by a translucent film which serves as a phase shift film of the phase shift mask blank so as to attenuate exposure light of predetermined intensity.

3. A method as claimed in claim 1, wherein the light absorption film is an opaque film.

4. A method as claimed in claim 1, wherein the laser beam is irradiated onto the mask blank so that the transparent glass substrate with the light absorption film has flatness not greater than 0.5 micron meter.

5. A lithography mask blank manufactured by the method claimed in claim 1.

6. A lithography mask manufactured by the use of the mask blank claimed in claim 5.

7. A lithography mask as recited in claim 6 wherein mask blank is a phase shift mask blank of a halftone type.

8. A method of manufacturing a lithography mask blank as claimed in claim 1 wherein the step of irradiating comprises heating the light absorption film for a period on the order of several tens of nanoseconds.

9. A method of manufacturing a lithography mask blank as claimed in claim 1 wherein the step of irradiating comprises heating the light absorption film to a temperature of at least 1000° C.

10. A method of manufacturing a lithography mask blank as claimed in claim 1 wherein the light absorption film comprises a light translucent film.

11. A method of manufacturing a lithography mask blank as claimed in claim 1 wherein the light absorption film comprises MoSiN.

* * * * *